United States Patent
Savas et al.

(10) Patent No.: US 7,361,605 B2
(45) Date of Patent: Apr. 22, 2008

(54) SYSTEM AND METHOD FOR REMOVAL OF PHOTORESIST AND RESIDUES FOLLOWING CONTACT ETCH WITH A STOP LAYER PRESENT

(75) Inventors: Stephen E. Savas, Fremont, CA (US); Wolfgang Helle, Baldham (DE)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 11/039,537

(22) Filed: Jan. 19, 2005

(65) Prior Publication Data

US 2005/0196967 A1 Sep. 8, 2005

Related U.S. Application Data

(60) Provisional application No. 60/537,652, filed on Jan. 20, 2004.

(51) Int. Cl.
*H01L 21/3213* (2006.01)

(52) U.S. Cl. ............... 438/708; 438/634; 438/639; 438/706; 438/714; 438/723; 438/738; 216/18; 216/37; 216/41; 216/63; 216/79

(58) Field of Classification Search .......... 216/18, 216/37; 438/706, 708; 252/79.1
See application file for complete search history.

(56) References Cited

U.S. PATENT DOCUMENTS

| | | | |
|---|---|---|---|
| 4,645,562 A * | 2/1987 | Liao et al. | ............... 438/640 |
| 4,861,424 A | 8/1989 | Fujimura et al. | |
| 4,861,732 A | 8/1989 | Fujimura et al. | |
| 4,980,022 A | 12/1990 | Fujimura et al. | |
| 5,403,436 A | 4/1995 | Fujimura et al. | |
| 5,660,682 A | 8/1997 | Zhao et al. | |
| 6,007,671 A | 12/1999 | Fujimura et al. | |
| 6,028,015 A | 2/2000 | Wang et al. | |
| 6,204,192 B1 | 3/2001 | Zhao et al. | |
| 6,281,135 B1 | 8/2001 | Han et al. | |
| 6,313,042 B1 | 11/2001 | Cohen et al. | |

(Continued)

OTHER PUBLICATIONS

Hirose et al, Ion-Implanted Photoresist and Damage-Free Stripping, Jan. 1994, J Electrochem Soc., vol. 141, No. 1, pp. 192-205.

(Continued)

*Primary Examiner*—Shamim Ahmed
*Assistant Examiner*—Maki Angadi
(74) *Attorney, Agent, or Firm*—Pritzkau Patent Group, LLC (57) ABSTRACT

In processing an integrated circuit structure including a contact arrangement that is initially covered by a stop layer, a first plasma is used to etch to form openings through an overall insulation layer covered by a patterned layer of photoresist such that one contact opening is associated with each contact. Stripping the patterned layer of photoresist and related residues is performed. After stripping, the stop layer is removed from the contacts. In one feature, the stop layer is removed from the contacts by etching the stop layer using a plasma that is generated from a plasma gas input that includes hydrogen and essentially no oxygen. In another feature, the photoresist is stripped after the stop layer is removed. Stripping the patterned layer of photoresist and the related residues is performed, in this case, using a plasma that is formed predominantly including hydrogen without oxygen.

23 Claims, 2 Drawing Sheets

U.S. PATENT DOCUMENTS

| | | |
|---|---|---|
| 6,457,477 B1 | 10/2002 | Young et al. |
| 6,536,449 B1 | 3/2003 | Ranft et al. |
| 6,630,406 B2 | 10/2003 | Waldfried et al. |
| 6,736,927 B2 | 5/2004 | Wang et al. |
| 6,787,452 B2 * | 9/2004 | Sudijono et al. ............ 438/637 |
| 6,805,139 B1 | 10/2004 | Savas et al. |
| 2001/0012694 A1 * | 8/2001 | Coburn et al. .............. 438/689 |
| 2003/0232494 A1 * | 12/2003 | Adams et al. .............. 438/622 |

OTHER PUBLICATIONS

U.S. Appl. No. 10/958,866, filed Oct. 4, 2004, Savas et al.

* cited by examiner

SYSTEM AND METHOD FOR REMOVAL OF PHOTORESIST AND RESIDUES FOLLOWING CONTACT ETCH WITH A STOP LAYER PRESENT

RELATED APPLICATION

The present application claims priority from U.S. Provisional Patent Application Ser. No. 60/537,652 filed on Jan. 20, 2004, which is incorporated herein by reference.

BACKGROUND OF THE INVENTION

The present invention is related generally to semiconductor fabrication and, more particularly, to a system and method for removal of photoresist following a contact etch, as part of integrated circuit manufacturing.

Figure 1:
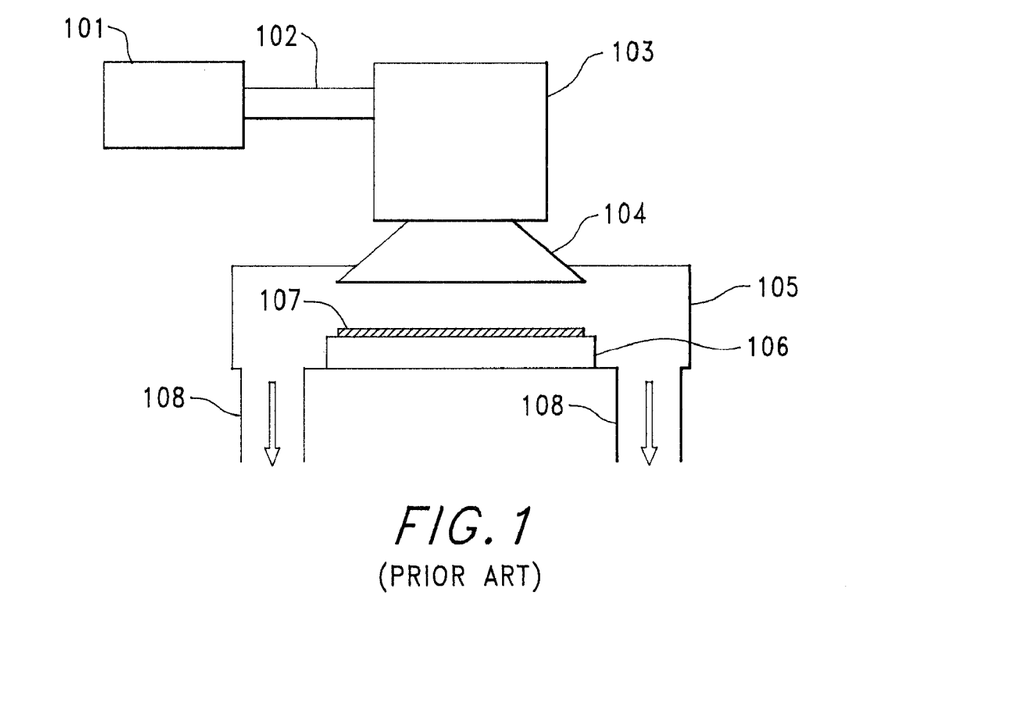
FIG. 1 is a diagrammatic view, in elevation, which illustrates a prior art system for stripping or ashing photoresist and related residues.

A schematic of a standard configuration of a photoresist (PR) stripping chamber and source is shown in FIG. 1. Gas coming from a set of flow controllers and valves 101, passes via tubing 102 to a plasma source 103. There, the gas becomes substantially dissociated (and weakly ionized) and then goes through a distribution/baffling system 104 into a wafer process enclosure 105. A pedestal 106 holds a wafer 107 which is to be stripped of PR and residues. On the wafer, radicals react with the PR and residues to form volatile or water-soluble reaction products that are then pumped out by ducts 108. This type of PR stripping chamber is widely used because it provides almost entirely neutral reactive species to strip the PR and does not subject the wafer to large amounts of charged particles that might damage the sensitive materials and layers used in making the integrated circuits. Such stripping systems are used for removing PR both during the early stages of IC fabrication, when the transistors are fabricated, as well as the later stages where the interconnecting metal lines are made to connect the transistors in a desired circuit pattern and to external circuits.

There are PR stripping applications done in the early stage of transistor fabrication on semiconductor wafers, including stripping after ion implantation and stripping after etching used to pattern layers or make openings. One of these stripping processes is done after etching through the first layer of insulation on the wafer to create openings to connect to the junctions and gate of the transistors. This latter etching process is called the "contact" etch. It is usually done in two steps, a dielectric etch and thin stop layer etch. PR removal processes for this application typically follow stop layer etch and may use a single step, but more commonly use two or more steps. It is submitted that current PR stripping processes for this application are likely to be inadequate to meet process requirements in the near future as the size of transistors continues to shrink, the thickness of critical layers on the wafer surface continues to decrease, and the materials used to make transistors is changed.

A standard contact etching process on wafers first opens holes through a silicon dioxide insulating layer covering the just-fabricated transistors. The etching process is stopped when it reaches a thin "stop" layer covering the silicide or metal materials in the junctions and gate. This stop layer is commonly formed of Silicon Nitride. but in future implementations, may be formed from other materials, and is used to protect a silicide junction underneath the insulating layer. Junction materials will be changing over the coming generations of semiconductor technology from cobalt silicide to nickel silicide for the 65 nm generation and possibly nickel-platinum silicide in the 32 nm generation of devices. At the same time, silicide thickness will be decreasing to 20 nm and then less. It is submitted that such thinner junctions using Nickel Silicide will suffer increased resistance with even a modest amount of chemical damage including oxidation of the silicide.

The silicon dioxide dielectric covering the stop layer must be etched to completion, though it has a different thickness above the gate than above source and drain. This etching process must be fast and aggressive to be cost-effective, so it uses more energetic ion bombardment to increase the rate and to get the desired vertical wall profile. Because of the damage this ion bombardment would cause to sensitive junctions and because of the varying thickness of the silicon dioxide layer, the etching process for silicon dioxide needs to be highly selective so that it does not penetrate the stop layer. Once the silicon dioxide is etched through, the wafers are put into a soft etching system that uses less energetic or no ion bombardment to gently etch the stop layer and uncover the silicide. At this point in the integration sequence, the un-etched, patterned PR layer still remains above the silicon dioxide, and polymer residues containing silicon are on the sidewalls both of PR and of the just-etched hole in the silicon dioxide. These need then to be removed without damaging the exposed silicide.

The conventional stripping and residue removal process following the contact and stop layer etching generally uses mostly oxygen gas fed to a plasma source, and may use wet chemicals or have a small addition of forming gas or fluorinated gas added in a second step to remove residues. However, most silicide materials used for junctions, including cobalt silicide and nickel silicide, are sensitive to oxygen and degraded in performance by it. Further, the fluorine in the residue removal step also attacks the silicide, causing degradation of ten or more Angstroms of material. In the past, including 130 nm IC technology, there has been sufficient thickness of silicide (or a protective sacrificial silicide used) that the material damaged by stripping and residue removal can afford to be lost without degrading circuit performance. Prior to deposition of an interconnect metal into the contact hole, the silicide surface is typically cleaned of damaged junction material by a sputter etching process.

Gas mixtures containing mainly oxygen have been the principal types of recipe used for all major stripping applications in transistor fabrication as part of IC manufacturing. Oxygen has been the gas of choice for more than 20 years because atomic oxygen reacts more strongly with organic polymers like PR than most other radicals so it gives the stripping process a very high rate that makes the process less expensive than when using other gases. Water vapor also produces high stripping rates in some types of systems but is more difficult to deliver in gaseous form at high flow rates as is oxygen. Higher reactivity of species makes stripping rates faster, and faster rates make stripping system productivity higher. Such high rates have been an economic necessity for competitive stripping for many years because photoresist thickness for older lithography technologies (preceding Deep Ultraviolet lithography at 248 nanometers) has been greater than a micron or more. Since there are typically twenty or more photoresist removal steps in the IC manufacturing process, high stripping rates, typically several microns per minute, are needed in stripping to keep IC costs low for mass-market products.

Gas mixtures having little or no oxygen or oxygen containing gas have been used with plasma-based systems since the early days of PR stripping where materials vulnerable to oxidation have been exposed on the wafer. One alternative to oxygen-based feed gases for stripping is hydrogen. In the early days of semiconductor IC fabs, hydrogen was employed as the main gas for stripping photoresist for some selected steps, during electrical interconnect formation, in the overall integrated circuit fabrication process to avoid oxidation of exposed interconnect metal on the wafers. Such an interconnect metal may include, for example, aluminum. This is currently the case for interconnect fabrication on integrated circuits where conducting wires on the wafer are made from copper. It is also true for other new materials such as low-k dielectrics. Consequently, processes employing high hydrogen concentration with no added oxygen are commonly used in the later stages of integrated circuit manufacture where copper and low-k dielectrics are exposed to the stripping reactive species (see for example, U.S. Pat. No. 6,630,406 issued to Walfried, et al.). In these processes, the hydrogen may also be used for reducing copper surfaces oxidized in previous steps.

Gas mixtures using hydrogen-containing gases with no oxygen have also been used for wafer surface treatments to avoid corrosion. In most cases, this was because metal surfaces or metal-containing residues left after stripping would form undesirable, typically oxide compounds on the surface of the wafer that would degrade the yield or performance of the IC. This and most other applications employing gas mixtures lacking oxygen have been steps in the fabrication of interconnects or wires between transistors.

Hydrogen has commonly been used as a minority additive in most of the PR stripping applications in the form of a dilute mixture in Nitrogen. This additive gas improved stripping rates slightly and greatly improved ability to wash residues away with a simple water rinse. It was also used in earlier generations of IC production by a few manufacturers to strip PR that had been exposed to ion implantation. The gas mixture having a small percentage (typically 3% to 4%) of hydrogen in nitrogen (called Forming Gas) has been a commonly used gas in semiconductor factories and safe for use in conventional PR stripping systems. Concerns such as electric charging, silicon damage or contamination, however, prevented the stripping processes using RIE with Forming Gas or Hydrogen from being commercially successful for PR Stripping and Residue removal. This was particularly the case for stripping as part of transistor fabrication, and was true even in the earlier generations of IC fabrication technology when devices were much less sensitive to such problems.

The present invention resolves the foregoing difficulties and concerns while providing still further advantages, as will be described.

SUMMARY OF THE DISCLOSURE

A method and system are described for use in an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching contact openings to reach a contact arrangement that is defined by the active device structure in which each contact of a plurality of contacts is covered by the stop layer. In one aspect of the invention, a first plasma is used to selectively etch, in cooperation with the patterned layer of photoresist, to form a plurality of contact openings through the overall insulation layer such that one contact opening is associated with each contact in a way which at least partially exposes the stop layer above each contact and which, at least potentially, produces etch related residues. Stripping of the patterned layer of photoresist and the related residues is performed. After stripping, the stop layer is removed from the contacts.

In another aspect of the present invention, as part of an overall technique for fabricating an integrated circuit on a wafer having an active device structure and as part of an intermediate step, a contact, which includes a silicide and which forms part of the active device structure, is protected by a stop layer. The stop layer is removed from the contact by etching the stop layer using a plasma that is generated from a plasma gas input that includes hydrogen and essentially no oxygen.

In still another aspect of the present invention, as part of an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching at least one contact opening to reach a silicide containing contact which is defined by the active device structure and covered by the stop layer, a method includes selectively etching, using a plasma in cooperation with the patterned layer of photoresist, to form a contact opening through the overall insulation layer such that the contact opening is associated with the contact in a way which at least partially exposes the stop layer above the contact and which, at least potentially, produces etch related residues. The stop layer is removed from the contacts using a second plasma that is formed predominantly from hydrogen gas in an absence of oxygen. Stripping the patterned layer of photoresist and the related residues is performed using a third plasma that is formed predominantly including hydrogen without oxygen.

BRIEF DESCRIPTION OF THE DRAWING

The present invention may be understood by reference to the following detailed description taken in conjunction with the drawings briefly described below.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein. It is noted that the drawings are not to scale and are diagrammatic in nature.

Figure 2:
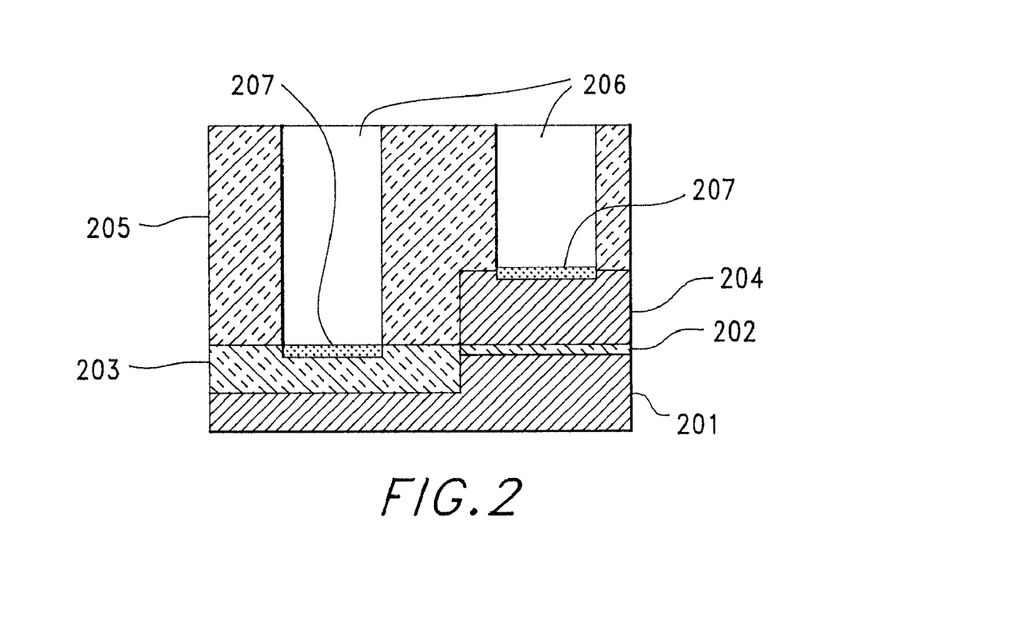
FIG. 2 is a diagrammatic view, in elevation, which illustrates an intermediate step in the formation of an integrated circuit transistor as part of front end processing of the integrated circuit.

It is recognized that, for purposes of current and future IC fabrication, there are additional serious concerns during stripping processes for integrity of the very thin layers used for junctions. Future generations of integrated circuits having critical dimension less than about 100 nanometers will be increasingly dependent on protecting the silicide layers that are electrical connection' points or junctions for the transistors being fabricated. The contact areas with both the junctions and the gate, shown in FIG. 2, may be sensitive to oxidation or other chemical or physical degradation. In this Figure, 201 is the substrate silicon; 202 is the gate dielectric; 203 is the junction, 204 is the gate electrode, 205 is the dielectric insulation encapsulating the transistors; 206 are the contact holes; and 207 are the areas of potential damage to the junction and gate materials comprising sensitive silicide surfaces that will be exposed following the contact etch.

Whereas in the past and currently (130 nm to 90 nm IC technologies), for the source and drain regions of the transistors, some loss or oxidation of silicide has been acceptable, in future generations of semiconductor manufacturing technology, it will be a requirement to avoid as much as possible the silicide loss or damage of the exposed surfaces of the junction. Thicknesses of the silicide used in these areas will soon be of the order of 200 Angstroms decreasing toward 100 Angstroms and thus loss of material or degradation of its electrical properties such as conductivity are not acceptable. Stripping processes activated by energetic ions, including nitrogen and hydrogen, which sputter materials from the wafer surface, and oxygen-based processes that oxidize the silicide will cause loss of or damage to the silicide.

In the next few IC fabrication technology nodes, there will be changes in transistor fabrication, an important part of semiconductor manufacturing technologies, that will reduce the need for high-rate, oxygen-based stripping processes. First, the thickness of photoresist layers is decreasing and will continue to decrease very rapidly over the next several years. Deep Ultraviolet PR—currently the advanced resist for semiconductor fabrication at the 130 nanometer node— is normally coated in a thickness of about 600 nanometers. Older photoresist types such as g-line and I-line, still used for lower resolution patterning, are typically more than a micron thick. The leading edge photoresist for lithography (193 nanometer radiation) used in 90 nanometer semiconductor fabrication, started in many factories in 2004, will typically be about 400 nanometers thick. As critical dimensions shrink in the next few technology generations leading edge IC Fabs may use PR with thickness in the range from 200 nanometers to 300 nanometers. Finally, the Extreme Ultraviolet lithography systems will use resist with thicknesses of only 100 nanometers or a little more. Therefore, for these new much thinner resist masks, it will not be necessary to have such high rates of photoresist removal to have acceptable or even high productivity. Since the photoresist layers for advanced lithography will be several times thinner than currently used, it will be acceptable for stripping chambers to have substantially slower stripping rates and still be economically competitive.

The stripping process application used in transistor fabrication that will be most oxygen sensitive is that following the etching of contacts. The contact etch process can be terminated when etching has reached the stop layer covering the junctions of the transistor that are currently cobalt silicide and will soon be nickel silicide. In the particular case of junctions made of nickel silicide, it has recently been found that oxygen exposure causes some degradation in the silicide properties. This probably is due to the oxidation of the nickel silicide to silicon oxide and nickel. Such exposure greatly decreases the electrical conductivity of the affected material and this is important to the speed of the IC. Therefore, it is recognized that it will be increasingly undesirable to use oxygen-based dry stripping processes to remove PR and residues that remain after contact etches.

In view of the foregoing, stripping and residue removal processes following the critical etching steps in transistor fabrication, will soon exhibit problems if using significant amounts of oxygen gas. Accordingly, it is proposed in this disclosure that hydrogen should become the principal source of chemically active species and substantial flows of it will likely be needed for stripping.

Figure 3:
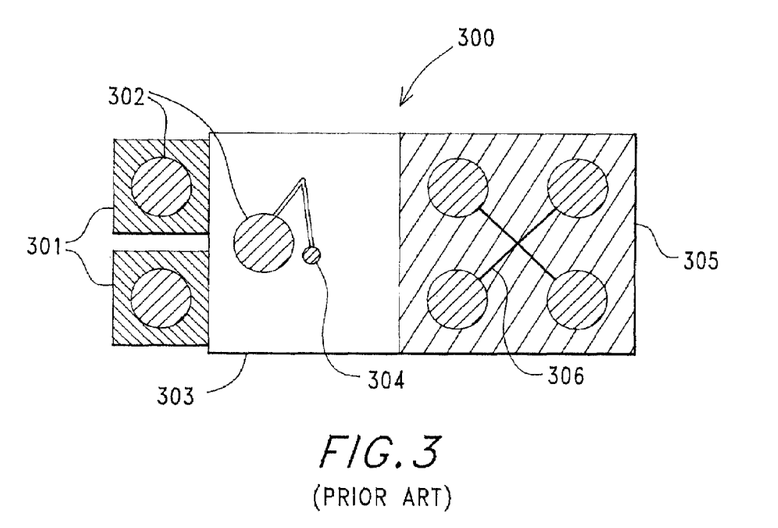
FIG. 3 is a diagrammatic plan view of a prior art system that is used for the conventional ashing of photoresist having a single loadlock.

Stripping systems that will need to use large amounts of hydrogen gas will require particular measures to avoid leakage of even small amounts of gas to the environment. This is more economically necessary since the costs for factory and equipment are so high—IC Fabs are the most expensive factories in the world at this time. Many PR stripping systems in use today do not have special safety systems to employ substantial amounts of hydrogen gas in processes. FIG. 3 is a conceptual drawing of the layout of a normal prior art stripping system, generally indicated by the reference number 300. This figure shows wafer loadports 301 feeding wafers 302 to a handling system 304, which puts them into a loadlock 303 from which they are loaded into a processing chamber 305. Wafers 302, to be processed in processing chamber 305, are indexed/rotated to different processing locations by a substrate rotation device 306. Such a system can allow substantial hydrogen leakage from the loadlock chamber under some circumstances. Since this will not be adequately safe for the Fab in the future, it will be necessary to take special precautions in the wafer handling and vacuum system of the stripping tool.

The present invention includes implementations for highly advantageous photoresist (PR), residue removal and Stop Layer Etching processes for use following the main dielectric patterning step in contact etching for IC fabrication. Such processes may be multi-step, and may have different gas compositions, gas pressures, wafer temperatures and plasma source configuration for each step. Different steps in the same process may be done in different chambers. Some of the process steps use hydrogen as exclusive or a main source of reactive gas. The advantages of the disclosed system and method reside in avoiding substantial damage to or loss of Nickel Silicide or other silicides exposed during formation of the contact holes used to make contact to the source, drain and gate of each transistor.

There are two alternative process integration sequence (IS) approaches in this invention. One alternative integration sequence (IS) of steps for the disclosed process includes stripping photoresist, removing residues on the inside surface of the etched hole in both dielectric and PR before etching through the stop layer and cleaning the surface of the junctions. This IS, an alternative to the usual sequence of such steps, may better avoid damage to the silicide material of the junctions by removing resist and residues while the stop layer is still intact to protect the sensitive junctions from the chemical damage from the stripping process. However, this integration sequence has heretofore been uneconomic since it involves processing wafers in an etcher, then in stripper and finally again in the etcher because stripping systems have been incapable of doing the stop layer etching process. Although some etchers do have integrated stripping stations they are not able to efficiently process wafers in this new and advantageous sequence. In part, this is because they are much more expensive than stripping systems and their productivity for the expensive etching process is reduced by the integration of the lower cost stripping step.

What would be more desirable, for this process integrating strip and stop layer etch then, is either a system capable of stripping and etching in the same chamber or designed to do stripping and etching sequentially in multiple chambers with the productivity and low capital cost of a stripping system. Such a system can then do the stripping step first inexpensively and with high productivity, and then do the stop layer etching—which is not as critical and difficult a process as the main dielectric etching—quickly and at low cost. However, to be successful in the stop layer etching process, where the photoresist mask has been already removed, this etching process must be very soft to avoid excessive removal of the main dielectric and faceting or rounding of the edge of the contact hole made by the initial dielectric etching. Further, to have both stripping and etching done in the process chamber in a mass production setting requires that the walls of the process chamber be kept in a stable and clean state. This is particularly difficult when the highly polymerizing main dielectric etching process is done in the same chamber. However, this is more easily done when the etching process is a short and non-selective one such as that to remove the stop layer. The Mattson Aspen III Highlands™ system is considered as an advantageous system for performing the photoresist strip and stop layer etch in one processing chamber.

Gas mixtures using hydrogen or oxygen as primary gas may be used for stripping the PR and removing residues. However, in some embodiments of the invention, there may be an advantage with respect to the use of a hydrogen-based gas mixture having little or no oxygen or nitrogen because this avoids hardening of the residues by oxidation and makes them easier to remove. It is advantageous in embodiments of this invention concerning this IS, that the etching of the stop layer is done using a hydrogen-based gas mixture that may include a fluorinated gas (such as $CF_4$ or other fluorocarbons, $SiF_4$, $NF_3$ or $SF_6$) but excludes oxygen. Stop layer etching for the IS in which stripping is done prior to stop layer etching should use ion bombardment to anisotropically remove the exposed stop layer. The stop layer etching should be completed with pure hydrogen or a mixture with helium to minimize sputtering of the silicide junction material as well as to scavenge fluorine which may have been used in a prior step. Because ion bombardment is used to activate reactions with the stop layer to promote etching, the temperature of this process step for these embodiments may be lower than normal stripping temperatures.

In the second IS for stripping—in which the stop layer is removed prior to photoresist stripping—embodiments of this invention are superior to the conventional oxygen-based stripping and cleaning process. Embodiments of the invention employ hydrogen-based gas mixture for stripping which excludes oxygen, thus avoiding oxidation damage to the silicide. Hydrogen is also the principal gas, to which only small amounts of fluorinated gas may be added, for residue removal. Further in this case, the final step in the process following stop layer etching uses only hydrogen and possibly a small amount of an added noble gas to clean the surface of the silicide.

The handling and process control system, that may be used with wafer processing chamber(s), uses multiple load locks and certain operating procedures to prevent any hydrogen from being released into the factory environment where it would be a fire/explosion hazard. Embodiments using the new sequence for PR and residue removal may be done at elevated temperatures such as above 100 Celsius, but the etching of the stop layer should use ion bombardment to provide activation energy and take place below or about 100 degrees Celsius. The process step for stop layer removal can be performed with the plasma source adjacent to the wafer, and additional power may be provided from the same source that generates the plasma or a separate source to increase energy of ions bombarding the wafer. A single chamber or multiple process chambers may be used for the multiple steps in processing the wafers.

Stripping with the described gas recipes should be done in an automated PR stripping system that may use an RF discharge plasma as a source for generating reactive radicals from injected gas. In this case, the wafer may be either remote from the plasma for a given step or may be adjacent to the plasma. The stripping system may also include a double load-locked wafer handling system for improved safety. This invention is not appropriate or effective for anisotropic etching of PR, which includes applications called dry development, since the high gas flows and process recipes are likely to cause undercut of the mask.

Specific gas mixtures and process conditions for removing PR and residues for each of these different applications are described below. Processing wafers with the conditions disclosed below, especially for IC devices at or beyond the 90 nanometer semiconductor technology node, results in superior integrated circuit performance. The significant advantage over the prior art resides in removing resist and residues while not damaging or removing more than a small number of Angstroms of the critical silicides that form part of the transistors.

For the above applications, processes may often be done either in a single step or in multiple steps, though multiple steps may give superior results in many cases. Any such step may, as an alternative embodiment of the disclosed method, use energetic ion bombardment. Steps that do so should use a stripping chamber configuration where the wafer is adjacent to the plasma. The exact proportions of hydrogen, noble gas and/or fluorine containing gases in the gas mixtures that may be used for embodiments of the invention will depend on both the total gas pressure, and whether power is used to provide bombarding energy to ions. The gas mixture for embodiments of the invention will also depend on whether the plasma source is adjacent to, or separated from the wafer. If the plasma source is isolated/remote from the wafer, neutral radicals are substantially responsible for the process and ion induced sputtering is absent.

In particular steps in applications that benefit from ion activation, embodiments of this invention may place the wafer adjacent to the plasma source. The plasma source, in this case, produces the needed ions as well as the neutral radicals to react with and volatize the organic polymer in the PR and/or convert residues. In this case, embodiments of the invention may also include providing an RF bias to the wafer-holding pedestal to accelerate the ions.

Precise composition of the gas mixture depends on the application and step in the process. In most applications, it is acceptable to add some inert gases, especially helium, in some or all steps which, in some cases, may be in even greater flow rates than the hydrogen. It is also acceptable, and may be helpful in many applications, to add small amounts of oxygen, nitrogen and/or fluorine containing gases so that the total of the concentrations in the plasma of oxygen, nitrogen and fluorine may be up to about 15% of that of hydrogen. The purposes for adding small amounts of such gases include enhancement of removal of PR or residues, as well as avoidance of etching, damage to or oxidation of the exposed sensitive surfaces. Oxygen or nitrogen containing gas additives, when included with the substantially larger amount of hydrogen in the gas mixture, substantially prevent etching or reduction of silicon oxide or other sensitive dielectrics that may be used as a protective layer on the wafer surface.

The stripping and residue removal processes may or may not use ion bombardment or high wafer temperature to promote the stripping or removal reactions in any or all steps. In particular, the plasma generation may use any of the well-known types of plasma sources such as microwave, inductively coupled or capacitively coupled. Generally, the disclosed stripping and residue removal processes may be done over a wide range of gas pressures, extending from about 2 mTorr to as much as about 5 Torr. The total flow of gas provided for the process may vary from about 50 standard cubic centimeters per minute to as much as about 20 thousand standard cubic centimeters per minute. The power provided to the plasma source may generally vary between about one hundred watts to as much as about 5 kilowatts. Wafer temperature may be from room temperature up to about 350 degrees Celsius. Some step(s) in stripping resist or removing residues may also use ion bombardment of modest energy (generally less than about 100 eV per ion) to promote chemical reactions for stripping or residue conversion. Power provided to energize ions, in the event that ion bombardment is to be used, may vary between about 10 Watts to as much as about 1000 Watts for 300 mm size wafers, depending on the gas pressure and the amount of power used to generate the plasma.

Gas Composition for Stripping and Residue Removal

For stripping and residue removal, the process may be divided into two major embodiments, one based on the new integration sequence in which PR and residues are removed prior to etching of the stop layer, and the other in which stop layer etching is done first and stripping afterward. In the case that stripping and residue removal are done first, with the stop layer intact, some embodiments of the invention use hydrogen gas as the major reactive gas for both stripping and PR removal. Nitrogen and/or fluorine containing gases in modest amounts (up to about 5% fluorine and 10% nitrogen) may be added to the hydrogen to accelerate the PR ashing and to aid in the removal of residues. Alternative embodiments may use added oxygen up to about 10% to improve stripping rate in this IS. Further, a step having higher oxygen percentage that cleans the reactor may be used prior to the etching of the stop layer since the silicide is protected from damage by the stop layer. In the other integration sequence, where the PR and residues are removed after the stop layer is etched, hydrogen gas should be used for stripping with only very small addition of fluorine or nitrogen. The stripping step may use very small additions of nitrogen (of order 3% or less) so that it avoids harm to the silicide. The residue removal step may also use only very small amounts of fluorinated gas (less than about 2% $CF_4$ or $SiF_4$ or others) and should be followed by a pure hydrogen step to clean the surface of the silicide of fluorine or any residual oxygen. In one alternative, the residue removal step uses very small amounts of fluorinated gas, as above, and may be followed by a pure hydrogen step for cleaning the surface of the silicide of fluorine or any residual oxygen. These gas mixtures may be used whether PR strip and residue removal are done with isotropic higher temperature process where no biasing of wafer for ion acceleration is used, or in processes with a wafer bias to accelerate ions.

One embodiment of the invention, with the stripping and residue removal prior to stop layer etching, uses hydrogen gas with about 10% nitrogen addition to strip resist, and hydrogen with about 2% fluorinated gas ($CF_4$ or other fluorocarbon) added to hydrogen to remove the residues. It is noted that this is particularly useful without ion acceleration. Helium may be added to the gas mixture if desired whether ion bombardment is used or not. In the IS with stripping done after stop layer etching, one embodiment of the invention uses hydrogen with addition of about 2% of nitrogen for stripping when ion bombardment is used. In this same embodiment, residue removal is done with principally hydrogen gas with up to about 1% fluorine addition. If ion bombardment is not used then about 5% nitrogen addition may be used for stripping with about 1% fluorinated gas addition. It is noted that this latter use of nitrogen and fluorine is not required.

Other Characteristics of the Disclosed Stripping or Residue Removal Processes not Depending on the IS Process conditions other than gas flows for the various embodiments of the disclosed invention include:

a) Process gas pressures may be between about two milliTorr and about 5 Torr with the lower process pressures—under about 100 mT—generally involving lower total gas flow rates.

b) The power provided to plasma sources such as microwave or inductive types to produce reactive species may be in the range from about 50 Watts to as much as about 5 kW. The power level for inductive plasma sources may be largely over the stated range for the entire range of pressures or flows. Power levels for microwave sources may be in the same range but use of higher power levels (>3 kW) requires larger volume sources—a liter or more—than the classic 1" tube-through a 2.45 GHz waveguide.

c1) The range of power for embodiments of the invention using capacitively coupled RF—whether for enhancing ion energy or generating the plasma—should be strictly limited depending on the gas pressure and the type of source. The limit will be a function of the gas pressure and the ion flux generated by the plasma source. For plasma sources using almost pure hydrogen and generating very high ion fluxes—exceeding several milliAmps per square centimeter—biasing power may be up to several hundred Watts for a 200 mm Wafer and proportionally higher for larger wafers. Use of lower pressure of gases reduces the maximum power allowable substantially—certainly to less than 100 Watts and perhaps even below 50 Watts for a 200 mm Wafer. When ion current densities are reduced, which is the case when the gas pressure is higher or plasma source power is lower, the power used to provide ion energy needs to be reduced proportionately.

c2) Normal capacitive discharges at pressures less than or about 100 mTorr, even when limited to very low power density—less than or about 0.05 Watts per square centimeter which is about 35 Watts power for a 300 mm wafer—may not have sufficiently low ion energy to avoid substantial sputtering or damage to critical materials. Discharges with hollow cathode configurations are sustainable at much lower voltages for a given power density and therefore are suitable for embodiments of the invention. However, in general, the ratio of the RF power to the wafer area in Watts per centimeter squared divided by the gas pressure in Torr should be less than or about 0.5. This low value for power density for pressures typically of one Torr or higher ensures that ion damage to the sensitive areas is within specified limits.

d. The total gas flow rate should be sufficient to provide for acceptable PR stripping or residue removal rates. For PR stripping, removal rates of several microns per minute have required reactive gas flows up to as much as about 20 liters of gas per minute. Such high rates will not normally be needed in the future for the relevant applications so that total reactive gas flow rates of about one hundred SCCM to as much as about 10,000 SCCM should include all normal processes. With the addition of inert diluents (since other reactive added gases have relatively small flows), the total might be as high as about 20,000 to even 30,000 SCCM. For steps where very small amounts of material are removed, such as for post-strip residues or etching of the stop layer, the total flows may be smaller. In such steps, total flows may be as low as 20 SCCM and as much as about 2,000 SCCM. Use of large amounts of inert gas may be helpful in cases where slowing the process is desirable but in general it is not needed.

In general, at pressures from about 2 mT to about 50 mT, total gas flows may typically be in the range of about 20 Standard cubic centimeters per minute Sccm) to as much as a few standard liters per minute (Slpm). At pressures above several hundred milliTorr, the gas flow is generally greater than or equal to one hundred Sccm but less than about 20 Slpm. At intermediate pressures (50 mT to about 200 mT), the total flow may be in the range from about 50 Sccm to as much as about 10 Slpm.

Characteristics of the Etching Process

Gas Composition for Etching

In the IS where stripping and residue removal precede etching of the stop layer, embodiments of the invention have the etching of the stop layer done mainly with hydrogen as the source gas. During the early seconds of this process step, a few percent or less of fluorine may be added. At later times in the process the fluorine should be stopped and the hydrogen gas (possibly diluted only with helium) used as the etching of the stop layer is completed. This minimizes damage to the silicide.

Other Characteristics of the Etching Process

Since the stop layer etching process is anisotropic, it is usually necessary to have an RF bias applied to the wafer holding pedestal. Typically, between 0.1 Watts/centimeter squared and about 1 Watt per centimeter squared of biasing power is applied to the pedestal holding the wafer. The gas pressure is typically in the range of a few mTorr to as much as a few Torr. The total gas flow is usually dependent on the pressure of operation. Typically, pressures above about a few hundred mTorr require total gas flow of between several hundred standard cubic centimeters per minute (Sccm) and about twenty standard liters per minute. Pressures below a few hundred mTorr require less gas—typically from about a few tens of Sccm to about a few standard liters per minute.

Apparatus for Stripping PR with Hydrogen-Based Process.

In general, stripping chamber(s) consisting of plasma source plus process chamber are part(s) of an automated PR stripping system including a robotic wafer handling system. In some cases, current wafer handling systems for stripping chambers may use a single stage vacuum load lock for wafers prior to inserting them into the vacuum chamber used for stripping. Non loadlocked systems can easily release any remaining hydrogen gas in the process chamber into the environment and therefore they may not be used for stripping processes employing large flows of hydrogen gas. Single load-lock systems make processing with substantial amounts of hydrogen gas somewhat safer since they prevent very much hydrogen leakage that may lead to accumulation at atmospheric pressure that could lead to explosions. However, even with these, there can still be release of small amounts of hydrogen from such a system because the loadlock alternately cycles to and from atmospheric pressure.

Figure 4:
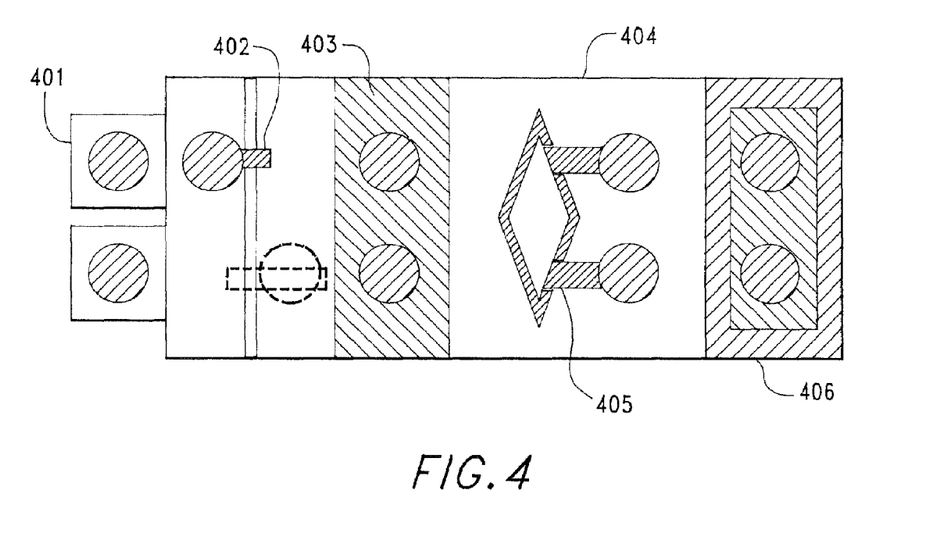
FIG. 4 is a diagrammatic plan view of a system, produced in accordance with the present invention, for use in ashing photoresist and removing related residues in which double loadlocks are provided.

One embodiment of a superior wafer processing apparatus for the stripping applications we address may employ a double load-locked wafer handling system (See FIG. 4) because it permits gas mixtures high in hydrogen gas to be very safely used. Double load-locks provide an extra margin of safety for the multi-billion dollar IC Fabrication facilities. In such a stripping system, the wafers are supplied for processing and returned from processing in cassettes or FOUPS (the current term in IC manufacture for a closed pod that holds wafers) placed on load ports 401. The wafers from the cassettes/FOUPS are moved by an automated handling robot 402 into a first vacuum load lock 403 which can hold two wafers or more. The first load lock is evacuated and the door to the second load lock is then opened. From the shelves of first load lock, the wafer is brought into a second load-locked chamber 404 by a vacuum robot 405. The door to the processing chamber is opened to remove the previously processed wafer and permit loading of a new wafer. The wafer to be processed is then moved into a processing chamber 406, after which the door is closed and the wafer is processed. The completed wafer is then removed from the processing chamber into the second load-lock by the same vacuum robot and placed into the first load lock when it is under vacuum. That first load lock is then re-pressurized to atmospheric pressure and the wafers removed from the first load lock by the atmospheric robot, 402. The wafers are then replaced into the cassettes/FOUPS where they are ready to move to the next production step. This system is superior because the second load lock is the only load lock open to the process chamber—and hence hydrogen gas—when wafers are loaded or unloaded. Yet, this second load lock is not pressurized to atmosphere or open to the atmosphere during normal operation.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein.

What is claimed is:

1. In an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching contact openings to reach a contact arrangement that is defined by the active device structure in which each contact of a plurality of contacts is covered by said stop layer, a method, comprising:

selectively etching, using a first plasma in cooperation with the patterned layer of photoresist, to form a plurality of contact openings through said overall insulation layer having contact hole edges such that one contact opening is associated with each contact in a way which at least partially exposes the stop layer above each contact and which, at least potentially, produces etch related residues;

stripping said patterned layer of photoresist and said related residues using a second plasma formed from a plasma gas input that includes hydrogen; and after stripping, removing said stop layer from said contacts to avoid excessive faceting or rounding of the contact hole edges.

2. The method of claim 1 wherein said plasma gas input includes up to approximately 10% by volume of a nitrogen containing gas.

3. The method of claim 1 wherein said plasma gas input includes up to approximately 5% by volume of a fluorine containing gas.

4. The method of claim 1 wherein said plasma gas input includes hydrogen gas with approximately 10% nitrogen containing gas and about 2% of a fluorinated gas.

5. The method of claim 4 wherein said fluorinated gas is carbon tetrafluoride.

6. The method of claim 4 wherein said plasma gas input includes helium.

7. The method of claim 1 wherein said second plasma is substantially nitrogen free.

8. The method of claim 1 wherein said second plasma is substantially oxygen free.

9. The method of claim 1 wherein said stop layer is formed from silicon nitride.

10. In an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching contact openings to reach a contact arrangement that is defined by the active device structure in which each contact of a plurality of contacts is covered by said stop layer and each contact includes a silicide, a method, comprising:

selectively etching, using a first plasma in cooperation with the patterned layer of photoresist, to form a plurality of contact openings through said overall insulation layer having contact hole edges such that one contact opening is associated with each contact in a way which at least partially exposes the stop layer above each contact and which, at least potentially, produces etch related residues;

stripping said patterned layer of photoresist and said related residues; and after stripping, removing said stop layer from said contacts using a second plasma that is formed predominantly from hydrogen gas in an absence of oxygen to avoid excessive faceting or rounding of the contact hole edges.

11. In an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching contact openings to reach a contact arrangement that is defined by the active device structure in which each contact of a plurality of contacts is covered by said stop layer, a method, comprising:

selectively etching, using a first plasma in cooperation with the patterned layer of photoresist, to form a plurality of contact openings through said overall insulation layer having contact hole edges such that one contact opening is associated with each contact in a way which at least partially exposes the stop layer above each contact and which, at least potentially, produces etch related residues;

stripping said patterned layer of photoresist and said related residues; and after stripping, removing said stop layer from said contacts using a second plasma to avoid excessive faceting or rounding of the contact hole edges and performing at least a concluding portion of the removal of said stop layer by forming said second plasma using only pure hydrogen.

12. The method of claim 10 wherein an initial portion of said removing includes forming said second plasma using a fluorinated gas in combination with said hydrogen gas.

13. In an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching contact openings to reach a contact arrangement that is defined by the active device structure in which each contact of a plurality of contacts is covered by said stop layer, a method comprising:

selectively etching, using a first plasma in cooperation with the patterned layer of photoresist, to form a plurality of contact openings through said overall insulation layer having contact hole edges such that one contact opening is associated with each contact in a way which at least partially exposes the stop layer above each contact and which, at least potentially, produces etch related residues;

stripping said patterned layer of photoresist and said related residues; and after stripping, removing said stop layer from said contacts using a second plasma to avoid excessive faceting or rounding of the contact hole edges and performing at least a concluding portion of the removal of said stop layer by forming said second plasma using a combination of only pure hydrogen and helium.

14. The method of claim 1 wherein said removing is performed with said second plasma using ion bombardment to anisotropically remove the stop layer.

15. In an overall technique for fabricating an integrated circuit on a wafer having an active device structure, during which fabrication, a patterned layer of photoresist is formed on an overall insulation layer that is itself supported directly on a silicon nitride stop layer that is, in turn, supported directly on the active device structure for use in etching at least one contact opening to reach a silicide containing contact which is defined by the active device structure and covered by the stop layer, a method, comprising:

selectively etching, using a first plasma in cooperation with the patterned layer of photoresist, to form a contact opening through said overall insulation layer such that the contact opening is associated with said contact in a way which at least partially exposes the stop layer above the contact and which, at least potentially, produces etch related residues;

stripping said patterned layer of photoresist and said related residues; and after stripping, removing said stop layer from said contacts using a second plasma that is formed predominantly from hydrogen gas in an absence of oxygen, said second plasma being formed from a plasma gas input that includes (i) hydrogen gas, (ii) a nitrogen containing gas in an amount up to approximately 10% by volume of the plasma gas input, and (iii) a fluorine containing gas up to approximately 5% by volume of the plasma gas input.

16. The method of claim 1 wherein at least a portion of said stripping is performed using a plasma that is generated using an input gas mixture consisting of hydrogen.

17. In an overall technique for fabricating an integrated circuit on a wafer having an active device structure and as part of an intermediate step a contact, which includes a silicide and which forms part of the active device structure, is protected by a stop layer, a method for removing said stop layer from the contact, said method comprising:

etching said stop layer using a plasma that is generated from a plasma gas input that includes hydrogen and essentially no oxygen to remove the stop layer from said contact.

18. The method of claim 17 including completing said etching of the stop layer using a gas mixture consisting of pure hydrogen gas as said plasma gas input.

19. The method of claim 17 including completing said etching of the stop layer using a combination of only pure hydrogen and helium as said plasma gas input.

20. The method of claim 17 including performing said etching anisotropically.

21. The method of claim 17 wherein said plasma gas input includes a fluorine containing gas.

22. The method of claim 21 wherein said fluorine containing gas is selected as at least one member of the group consisting of a fluorocarbon, $SiF_4$, $NF_3$ and $SF_6$.

23. In an overall technique for fabricating an integrated circuit on a wafer having an active device structure, during which fabrication, a patterned layer of photoresist is formed on an overall insulation layer that is itself supported directly on a stop layer that is, in turn, supported directly on the active device structure for use in etching contact openings to reach a contact arrangement that is defined by the active device structure in which each contact of a plurality of contacts is covered by said stop layer, a method, comprising:

selectively etching, using a first plasma in cooperation with the patterned layer of photoresist, to form a plurality of contact openings through said overall insulation layer having contact hole edges such that one contact opening is associated with each contact in a way which at least partially exposes the stop layer above each contact and which, at least potentially, produces etch related residues;

stripping said patterned layer of photoresist and said related residues; and after stripping, removing said stop layer from said contacts using a plasma that is predominately formed from hydrogen to avoid excessive faceting or rounding of the contact hole edges.

* * * * *